United States Patent
Chen et al.

(10) Patent No.: US 8,092,714 B2
(45) Date of Patent: *Jan. 10, 2012

(54) PHOSPHORS AND LIGHTING APPARATUS USING THE SAME

(75) Inventors: Teng-Ming Chen, Hsinchu (TW); Hsiao-Ping Tai, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 595 days.

This patent is subject to a terminal disclaimer.

(21) Appl. No.: 12/241,380

(22) Filed: Sep. 30, 2008

(65) Prior Publication Data

US 2009/0021144 A1    Jan. 22, 2009

(30) Foreign Application Priority Data

Jan. 10, 2008    (TW) ............................... 97100986 A

(51) Int. Cl.
*H01L 33/00* (2010.01)
*C09K 11/71* (2006.01)
(52) U.S. Cl. .................... 252/301.4 P; 257/98; 313/503
(58) Field of Classification Search ............ 252/301.4 P; 257/98; 313/503
See application file for complete search history.

(56) References Cited

U.S. PATENT DOCUMENTS

| 6,294,800 | B1 | 9/2001 | Duggal et al. |
| 6,466,135 | B1 | 10/2002 | Srivastava et al. |
| 6,469,322 | B1 | 10/2002 | Srivastava et al. |
| 6,555,958 | B1 | 4/2003 | Srivastava et al. |
| 6,809,781 | B2 | 10/2004 | Setlur et al. |
| 6,939,481 | B2 | 9/2005 | Srivastava et al. |
| 6,982,045 | B2 | 1/2006 | Menkara et al. |
| 7,229,332 | B2 | 6/2007 | Liu et al. |
| 2008/0309219 | A1* | 12/2008 | Chen et al. ............ 313/501 |

FOREIGN PATENT DOCUMENTS

| CA | 880800 | * | 9/1971 |
| GB | 1498796 | * | 1/1978 |

OTHER PUBLICATIONS

Poort et al, "Optical properties of eu+3 -activated orthosilicates and orthophosphates", Jurn. alloys compounds, 260, pp. 93-97, 1997.*

* cited by examiner

*Primary Examiner* — Carol M Koslow
(74) *Attorney, Agent, or Firm* — Muncy, Geissler, Olds & Lowe, PLLC

(57) ABSTRACT

A phosphor has a chemical formula of: $A_m(Ba_{1-x}Eu_x)_nP_yO_z$, wherein A is at least one of the group consisting of Li, Na and K, while $0<m<10$, $0<n<10$, $0<y<10$, $m+n+y=3/4$ z, and $0.001<x<0.8$.

7 Claims, 5 Drawing Sheets

PHOSPHORS AND LIGHTING APPARATUS USING THE SAME

BACKGROUND OF THE INVENTION

1. Technical Field

The present invention relates to phosphors and, more particularly, to phosphors for use in a lighting apparatus.

2. Description of Related Art

Semiconductor lighting apparatuses include light-emitting diodes (LEDs) and laser diodes. Semiconductor lighting apparatuses which provide ultraviolet or near ultraviolet light can be used in combination with different phosphors to make various kinds of light sources.

Of all the new products in the LED industry, white light-emitting diodes have the greatest potential in commoditization and popularization because they provide such advantages as having a small size, low heat generation, low energy consumption and long glowing persistence. Therefore, white light-emitting diodes can be applied to the illumination for daily use and hopefully replace fluorescent lamps and the conventional light sources used in the back lights of flat-panel displays. The so-call "white light" is in fact a combination of various color lights. A white light visible to human eyes must comprise a combination of at least two categories of lights of different colors, such as a combination of blue and yellow lights or a combination of green, blue and red lights.

Presently, most of the commercial white lighting apparatuses generate a white light by using a phosphor powder of $Y_3Al_5O_{12}$:Ce (YAG:Ce), which emits a yellow light when excited and combined with a blue LED. This commercial yellow-emitting phosphor powder is prepared through a solid-state sintering reaction at a high temperature ranging from 1400° C. to 1600° C., and can be excited by a blue LED having an emission wavelength of 467 nm to produce a yellow light having an emission light of 550 nm, whose CIE chromaticity coordinate is (0.48, 0.50).

This yellow-emitting phosphor powder for use with a blue LED is synthesized under a strict condition, namely, through a solid-state sintering reaction at a relatively high temperature. Moreover, this yellow-emitting phosphor powder shows a poor color rendering property when used in a white-light lighting apparatus because the powder emits a light that lacks a blue light component.

As to the commercial blue-emitting phosphor powder, $(Ba_{0.8}Eu_{0.2})MgAl_{10}O_{17}$ (abbreviated as BAM) of Kasei Optonix, a Japanese phosphor company, has the widest applications. In addition to application in semiconductor lighting apparatuses, BAM is indispensable in plasma display devices. However, BAM has such disadvantages as a short glowing persistence and being unstable under an ultraviolet light. Still worse, the maximal emission wavelength of BAM tends to shift towards a longer wavelength during the manufacturing process, so that the color performance of BAM is biased to a green light and thus results in a lower color purity.

BRIEF SUMMARY OF THE INVENTION

A primary objective of the present invention is to provide a series of phosphors having novel compositions.

A second objective of the present invention is to provide a series of phosphors that can be excited by an ultraviolet light, a near ultraviolet light and a blue light, and provide a blue light radiation source when excited.

A third objective of the present invention is to provide a lighting apparatus, wherein a semiconductor light source is used in combination with a phosphor so that the lighting apparatus is applicable to a cell phone panel, an automobile headlight and an illuminating apparatus for daily use.

To achieve these ends, the present invention provides a series of phosphors having a chemical formula of: $A_m(Ba_{1-x}Eu_x)_nP_yO_z$, wherein A is at least one of the group consisting of Li, Na and K, while 0<m<10, 0<n<10, 0<y<10, m+n+y=3/4 z, and 0.001<x<0.8.

The present invention further provides a lighting apparatus comprising a semiconductor light source and a phosphor, which has a chemical formula of: $A_m(Ba_{1-x}Eu_x)_nP_yO_z$, wherein A is at least one of the group consisting of Li, Na and K, while 0<m<10, 0<n<10, 0<y<10, m+n+y=3/4 z, and 0.001<x<0.8.

BRIEF DESCRIPTION OF THE SEVERAL VIEWS OF THE DRAWINGS

The invention as well as a preferred mode of use, further objectives and advantages thereof will best be understood by reference to the following detailed description of illustrative embodiments when read in conjunction with the accompanying drawings, wherein.

DETAILED DESCRIPTION OF THE INVENTION

A detailed description of the present invention will be given below with reference to preferred embodiments thereof, so that a person skilled in the art can readily understand features and functions of the present invention after reviewing the content disclosed herein. The present invention can be carried out or applied in other embodiments, where changes and modifications can be made to the details disclosed herein from a viewpoint different from that adopted in this specification without departing from the spirit of the present invention.

Phosphors according to the present invention are prepared through a solid-state reaction at a high temperature. A preferred embodiment of the present invention is $Na(Ba_{1-x}Eu_x)PO_4$, which is prepared by a method comprising the following steps. To begin with, barium carbonate ($BaCO_3$), sodium carbonate ($Na_2CO_3$), europium sesquioxide ($Eu_2O_3$) and diammonium hydrogen phosphate (($NH_4)_2HPO_4$) are weighed stoichiometrically, followed by thorough mixing and then ground for ten minutes. Next, the resultant mixture is put into a crucible and placed in a high-temperature furnace to fire in air at a temperature ranging from about 1000° C. to about 1300° C. for several hours. Following that, the sintered product is put into an alumina boat and placed in a high-temperature tube furnace to refire in a mixed atmosphere of hydrogen and argon at a temperature ranging from about 700° C. to about 950° C. for four to seven hours. The final product is a phosphor according to the present invention.

In the method described above, sodium carbonate ($Na_2CO_3$) can be replaced by various metal salts such as lithium carbonate ($Li_2CO_3$) or potassium carbonate ($K_2CO_3$). Accordingly, using different metal salts may produce the phosphors of the present invention, i.e., $A_m(Ba_{1-x}Eu_x)_nP_yO_z$, wherein A is at least one of the group consisting of Li, Na and K, while $0<m<10$, $0<n<10$, $0<y<10$, $m+n+y=3/4\ z$, and $0.001<x<0.8$.

Figure 1:
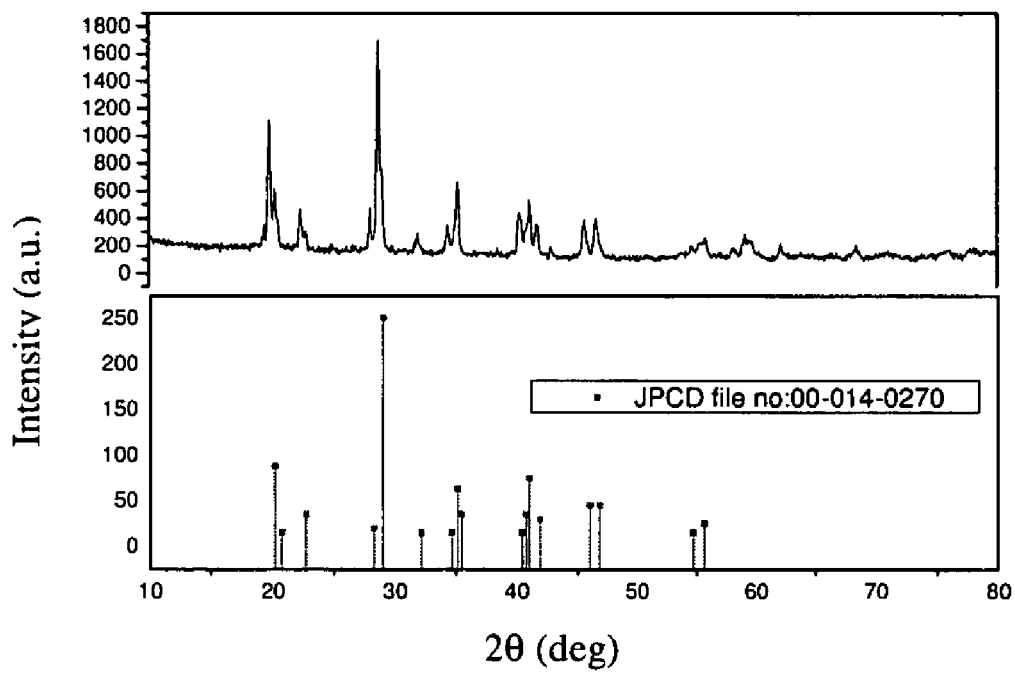
FIG. 1 shows X-ray powder diffraction patterns of $Li(Ba_{0.99}Eu_{0.01})PO_4$ according to a first preferred embodiment of the present invention.
Figure 2:
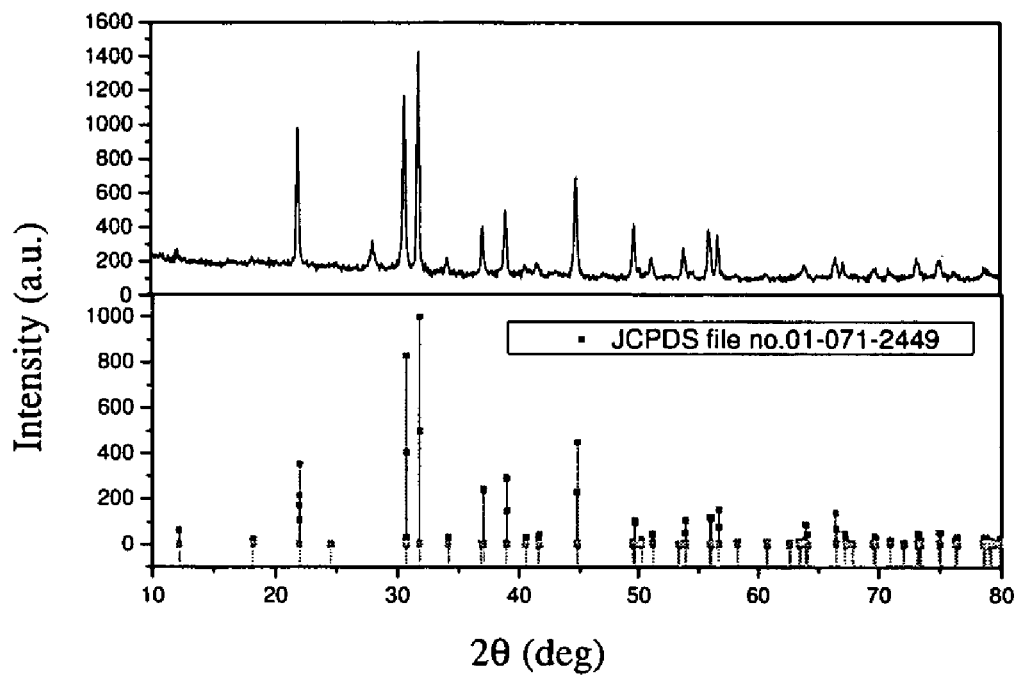
FIG. 2 shows X-ray powder diffraction patterns of $Na(Ba_{0.99}Eu_{0.01})PO_4$ according to a second preferred embodiment of the present invention.
Figure 3:
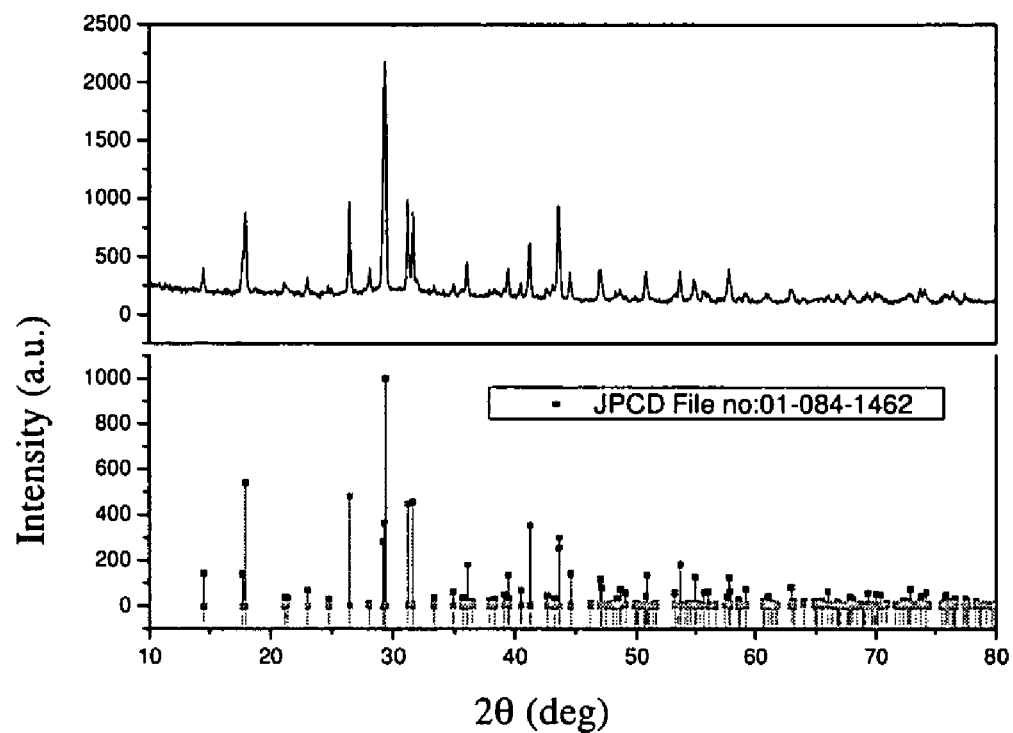
FIG. 3 shows X-ray powder diffraction patterns of $K(Ba_{0.99}Eu_{0.01})PO_4$ according to a third preferred embodiment of the present invention.

FIGS. 1, 2, and 3 represent the X-ray powder diffraction patterns of the products of the preferred embodiments of the present invention, $Li(Ba_{0.99}Eu_{0.01})PO_4$, $Na(Ba_{0.99}Eu_{0.01})PO_4$ and $K(Ba_{0.99}Eu_{0.01})PO_4$, respectively, which are all prepared by the method mentioned above. The comparison on the X-ray diffraction profiles between the crystalline phase of said products and the relevant literature database confirm that the main substances of the products of the present invention do have the same crystal structures of $LiBaPO_4$, $NaBaPO_4$ and $KBaPO_4$.

Figure 4:
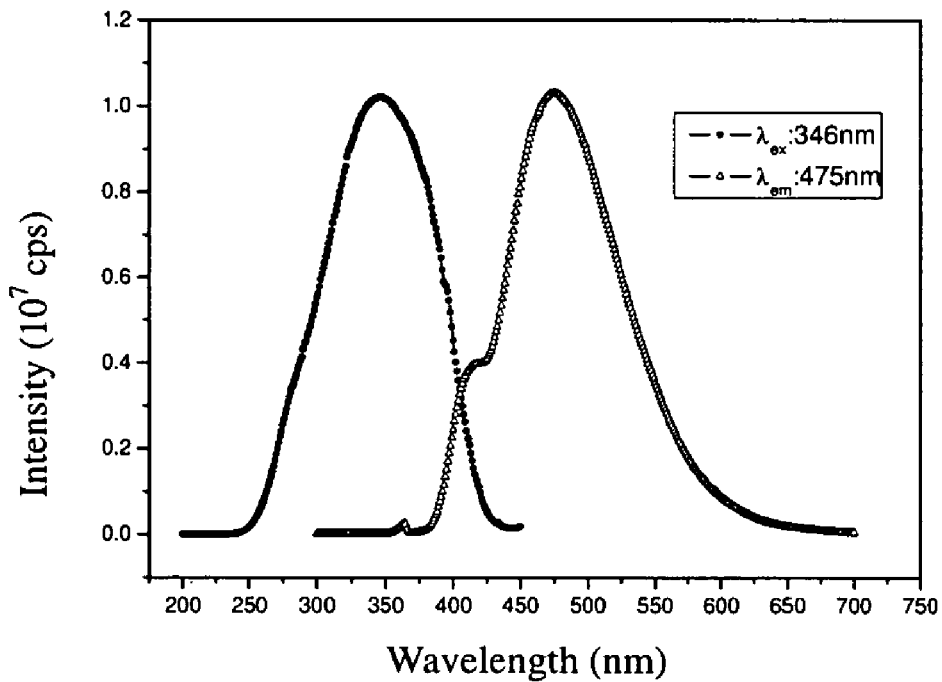
FIG. 4 shows excitation and emission spectra of $Li(Ba_{0.99}Eu_{0.01})PO_4$ according to the first preferred embodiment of the present invention.

Referring to FIG. 4, a fluorescence spectrophotometer was used to measure the excitation and emission spectra of $Li(Ba_{0.99}Eu_{0.01})PO_4$, which was prepared as one of the preferred embodiment of the present invention. It is shown that $Li(Ba_{0.99}Eu_{0.01})PO_4$ provided by the present invention has an absorption band with wavelength ranging from about 250 nm to about 420 nm, wherein a maximal absorption peak occurs at about 346 nm. Furthermore, $Li(Ba_{0.99}Eu_{0.01})PO_4$ has an emission band with wavelength ranging from about 400 nm to about 600 nm, wherein a maximal emission peak occurs at about 475 nm. FIG. 4 clearly demonstrates that $Li(Ba_{0.99}Eu_{0.01})PO_4$ can be excited by an ultraviolet light, a near ultraviolet light or a blue light, and emits a blue light when excited.

Figure 5:
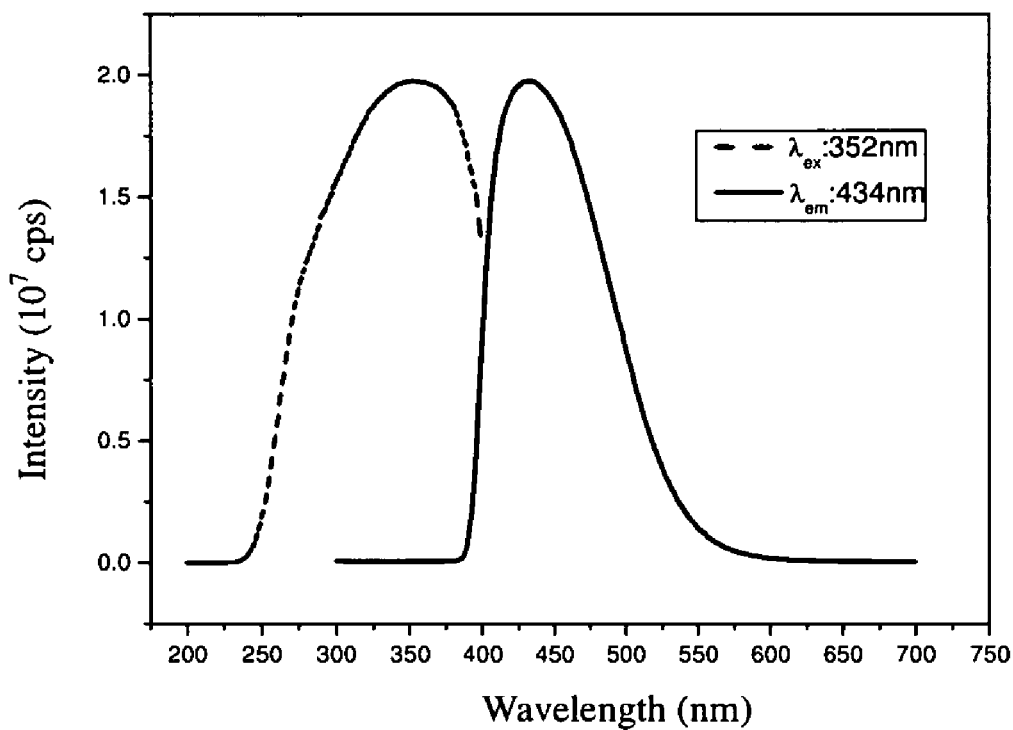
FIG. 5 shows excitation and emission spectra of $Na(Ba_{0.99}Eu_{0.01})PO_4$ according to the second preferred embodiment of the present invention.

Referring to FIG. 5, the fluorescence spectrophotometer was used to produce the excitation and emission spectra of $Na(Ba_{0.99}Eu_{0.01})PO_4$, which was prepared as another preferred embodiment of the present invention. It is shown that $Na(Ba_{0.99}Eu_{0.01})PO_4$ provided by the present invention has an absorption band whose wavelength ranges from about 250 nm to about 420 nm, wherein a maximum-absorption peak occurs at a wavelength of about 352 nm. Furthermore, $Na(Ba_{0.99}Eu_{0.01})PO_4$ has an emission band whose wavelength ranges from about 400 nm to about 550 nm, wherein a maximum-emission peak occurs at a wavelength of about 434 nm. FIG. 5 clearly demonstrates that $Na(Ba_{0.99}Eu_{0.01})PO_4$ can be excited by an ultraviolet light, a near ultraviolet light or a blue light, and emits a blue light when excited.

Figure 6:
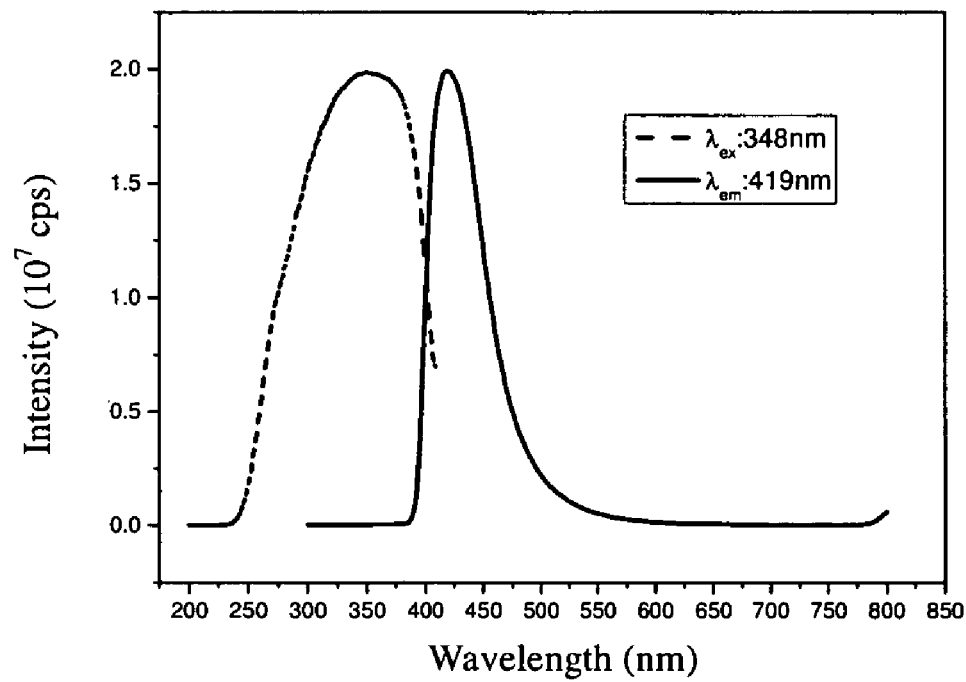
FIG. 6 shows the excitation and emission spectra of $K(Ba_{0.99}Eu_{0.01})PO_4$ according to the third preferred embodiment of the present invention.

Referring to FIG. 6, the fluorescence spectrophotometer was used to produce the excitation and emission spectra of $K(Ba_{0.99}Eu_{0.01})PO_4$, which was prepared as yet another preferred embodiment of the present invention. It is shown that $K(Ba_{0.99}Eu_{0.01})PO_4$ provided by the present invention has an absorption band whose wavelength ranges from about 250 nm to about 420 nm, wherein a maximum-absorption peak occurs at a wavelength of about 348 nm. Furthermore, $K(Ba_{0.99}Eu_{0.01})PO_4$ has an emission band whose wavelength ranges from about 400 nm to about 500 nm, wherein a maximum-emission peak occurs at a wavelength of about 419 nm. FIG. 6 clearly demonstrates that $K(Ba_{0.99}Eu_{0.01})PO_4$ can be excited by an ultraviolet light or a near ultraviolet light, and emits a blue light when excited.

Figure 7:
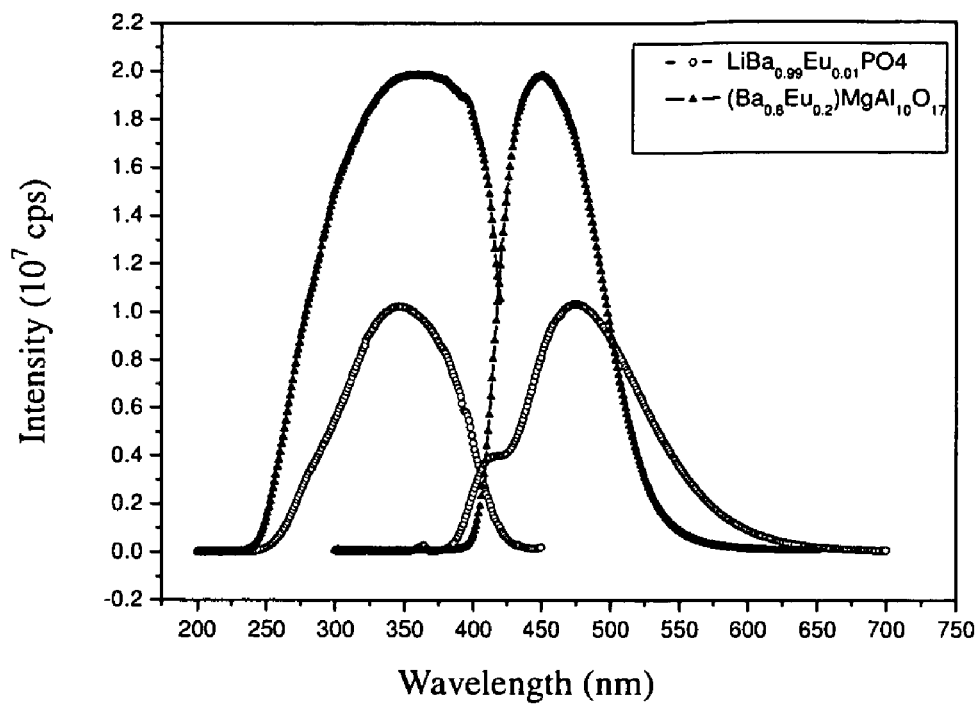
FIG. 7 shows a comparison of excitation and emission spectra between $Li(Ba_{0.99}Eu_{0.01})PO_4$ according to the first preferred embodiment of the present invention and the commercially available phosphor product of $(Ba_{0.8}Eu_{0.2})MgAl_{10}O_{17}$.
Figure 8:
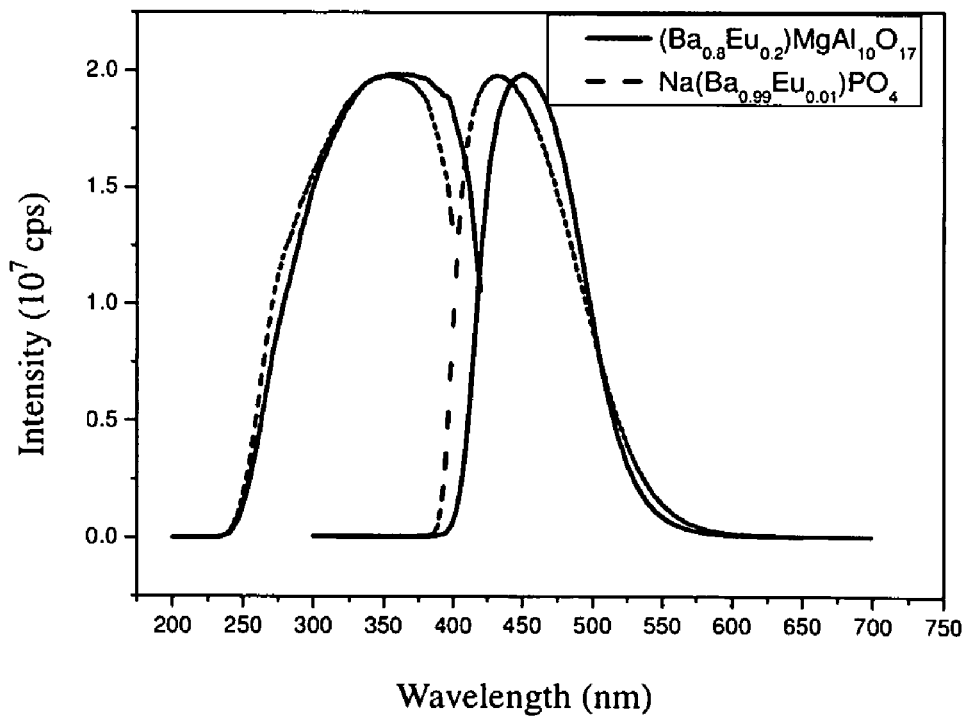
FIG. 8 shows a comparison of excitation and emission spectra between $Na(Ba_{0.99}Eu_{0.01})PO_4$ according to the second preferred embodiment of the present invention and the commercially available phosphor product of $(Ba_{0.8}Eu_{0.2})MgAl_{10}O_{17}$.
Figure 9:
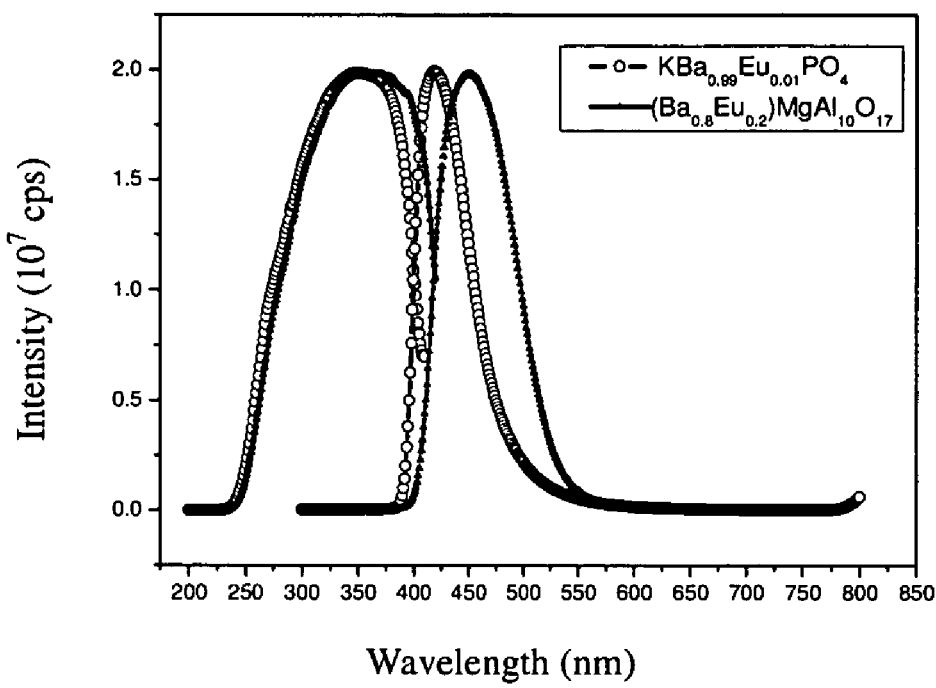
FIG. 9 shows a comparison of excitation and emission spectra between $K(Ba_{0.99}Eu_{0.01})PO_4$ according to the third preferred embodiment of the present invention and the commercially available phosphor product of $(Ba_{0.8}Eu_{0.2})MgAl_{10}O_{17}$.

FIGS. 7 to 9 show a comparison of the excitation and emission spectra among $Li(Ba_{0.99}Eu_{0.01})PO_4$, $Na(Ba_{0.99}Eu_{0.01})PO_4$ and $K(Ba_{0.99}Eu_{0.01})PO_4$ according to the preferred embodiments of the present invention and the commodity phosphor $(Ba_{0.8}Eu_{0.2})MgAl_{10}O_{17}$ from Kasei Optonix. It is shown that the three phosphors prepared according to the present invention have emission intensities and brightness similar to those of the commercial product, $(Ba_{0.8}Eu_{0.2})MgAl_{10}O_{17}$. Furthermore, the phosphors of the present invention have broader excitation bands than $(Ba_{0.8}Eu_{0.2})MgAl_{10}O_{17}$ does, and are therefore more suitable for use with ultraviolet or near ultraviolet-pumped diodes.

Figure 10:
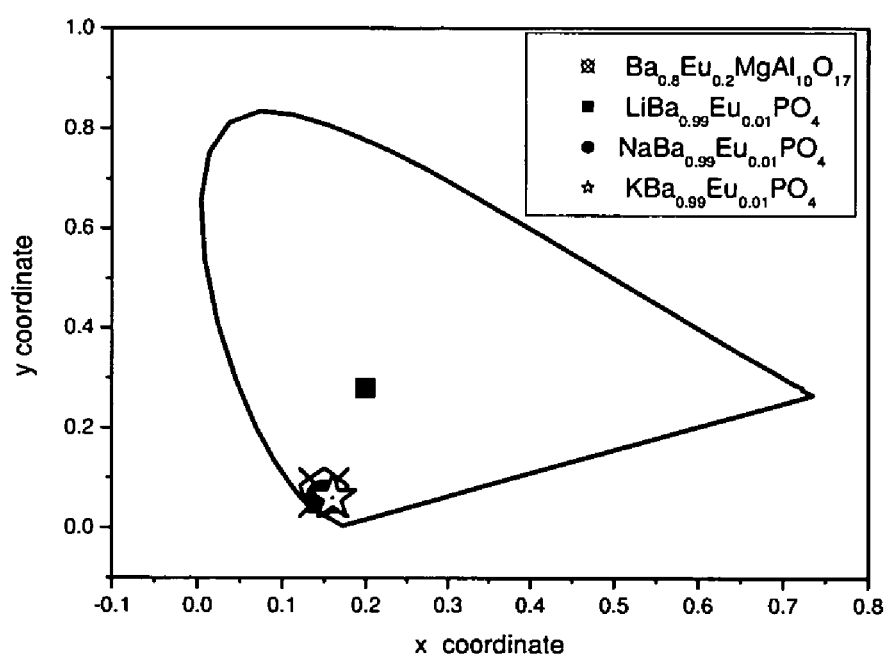
FIG. 10 shows a comparison of CIE chromaticity coordinates between $Li(Ba_{0.99}Eu_{0.01})PO_4$, $Na(Ba_{0.99}Eu_{0.01})PO_4$ and $K(Ba_{0.99}Eu_{0.01})PO_4$ according to the preferred embodiments of the present invention and the commercially available phosphor product of $(Ba_{0.8}Eu_{0.2})MgAl_{10}O_{17}$.

FIG. 10 shows a comparison of CIE chromaticity coordinates among $Li(Ba_{0.99}Eu_{0.01})PO_4$, $Na(Ba_{0.99}Eu_{0.01})PO_4$ and $K(Ba_{0.99}Eu_{0.01})PO_4$ according to the preferred embodiments of the present invention and the commodity phosphor $(Ba_{0.8}Eu_{0.2})MgAl_{10}O_{17}$ from Kasei Optonix. It is shown that the phosphors of the present invention have higher color purities than the commodity phosphor $(Ba_{0.8}Eu_{0.2})MgAl_{10}O_{17}$ does.

Therefore, the phosphors according to the present invention can be applied to a lighting apparatus comprising a semiconductor light source such as an LED or a laser diode, wherein the semiconductor light source emits an ultraviolet light or a near ultraviolet light. When the semiconductor light source is used in combination with the phosphors of the present invention, the lighting apparatus emits a blue light.

This lighting apparatus can emit a white light or a light similar to the white light if the lighting apparatus further comprises a red-emitting phosphor and a green-emitting phosphor, wherein the red-emitting phosphor can be $(Sr,Ca)S:Eu^{2+}$, $(Y,La,Gd,Lu)_2O_3:Eu^{3+},Bi^{3+}$, $(Y,La,Gd,Lu)_2O_2S:Eu^{3+},Bi^{3+}$, $Ca_2Si_5N_8:Eu^{2+}$ or $(Zn,Cd)S:Ag,Cl$, while the green-emitting phosphor can be $ZnS:Cu$ or $BaMgAl_{10 17}Eu^{2+}$.

In summary, the phosphors according to the present invention have not only novel compositions but also broad excitation bands (spanning from an ultraviolet to a blue light region), and are therefore suitable for use in combination with commercially available ultraviolet LED chips. Furthermore, the phosphors according to the present invention can be used in the production of various lighting apparatuses, and more particularly a white-light lighting apparatus if the phosphors according to the present invention are used in combination with a red-emitting phosphor and a blue-light phosphor.

The preferred embodiments of the present invention have been provided for illustrative purposes only and are not intended to limit the scope of the present invention in any way. Moreover, as the content disclosed herein should be readily understood and can be implemented by a person skilled in the art, all equivalent changes or modifications which do not depart from the spirit of the present invention are encompassed by the appended claims.

The invention claimed is:

1. A lighting apparatus comprising:
   a semiconductor light source;
   a phosphor which can be excited by the semiconductor light source and has a chemical formula of:

$A_m(Ba_{1-x}Eu_x)_n P_y O_z$; and a red-emitting phosphor and a green-emitting phosphor, wherein A is at least one of group consisting of Li, Na and K, while 0<m<10, 0<n<10, 0<y<10, m+n+y=3/4 z, and 0.001<x<0.8.

2. The lighting apparatus as claimed in claim 1, wherein the semiconductor light source comprises a light-emitting diode.

3. The lighting apparatus as claimed in claim 1, wherein the semiconductor light source comprises a laser diode.

4. The lighting apparatus as claimed in claim 1, wherein the semiconductor light source emits an ultraviolet light or a near ultraviolet light.

5. The lighting apparatus as claimed in claim 1, wherein the red-emitting phosphor is $(Sr,Ca)S:Eu^{2+}$, $(Y,La,Gd,Lu)_2O_3:Eu^{3+},Bi^{3+}$, $(Y,La,Gd,Lu)_2O_2S:Eu^{3+},Bi^{3+}$, $Ca_2Si_5N_8:Eu^{2+}$ or $(Zn,Cd)S:Ag,Cl$.

6. The lighting apparatus as claimed in claim 1, wherein the green-emitting phosphor is ZnS:Cu or $BaMgAl_{10}O_{17}Eu^{2+}$.

7. The lighting apparatus as claimed in claim 1, wherein the x in the chemical formula of the phosphor has a value of 0.01.

* * * * *